(12) United States Patent
Huang et al.

(10) Patent No.: US 7,839,212 B2
(45) Date of Patent: Nov. 23, 2010

(54) METHOD AND APPARATUS FOR A HIGH BANDWIDTH AMPLIFIER WITH WIDE BAND PEAKING

(75) Inventors: Dawei Huang, San Diego, CA (US); Arif Amin, Fremont, CA (US); Waseem Ahmad, Union City, CA (US); Rajesh Kumar, Sunnyvale, CA (US); Venkatesh Arunachalam, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 27 days.

(21) Appl. No.: 12/327,865

(22) Filed: Dec. 4, 2008

(65) Prior Publication Data

US 2010/0141340 A1      Jun. 10, 2010

(51) Int. Cl.
*H03F 3/45*      (2006.01)
(52) U.S. Cl. .......................................... 330/69; 330/252
(58) Field of Classification Search .................. 330/69, 330/252, 310, 98, 150
See application file for complete search history.

(56) References Cited

U.S. PATENT DOCUMENTS

| | | | | |
|---|---|---|---|---|
| 4,146,844 A | * | 3/1979 | Quinn | 330/149 |
| 6,150,884 A | * | 11/2000 | Fattaruso | 330/257 |
| 6,204,980 B1 | * | 3/2001 | Momtaz et al. | 360/29 |
| 6,982,596 B2 | * | 1/2006 | Kumeta et al. | 330/253 |
| 7,292,095 B2 | * | 11/2007 | Burt et al. | 330/9 |

OTHER PUBLICATIONS

Voorman et al., "Tunable Bipolar and biCMOS Gm-C Filters for High-Frequencies," Analog Circuit Design, Edited by Sansen et al., Kluwer Academic Publishers, pp. 287-306, 1999.

* cited by examiner

*Primary Examiner*—Henry K Choe
(74) *Attorney, Agent, or Firm*—Gregory P. Durbin; Polsinelli Shughart PC

(57) ABSTRACT

A two stage fully differential amplifier has been designed which works, in tandem with a TX-FIR, as a linear equalizer at low frequencies, not covered by the TX-FIR, and also acts as a linear amplifier at higher frequencies which are equalized by the TX-FIR. The amplifier as a frequency response which does not attenuate signals frequencies less than one twentieth of baud rate, creates gain peaking ion the region between one twentieth and one tenth of baud rate and maintains flat peak gain up to half of baud rate. Different aspects of the frequency response curve (such as dc gain, max gain and zero frequency) are completely programmable. Also, the differential amplifier has been designed from low power and process, voltage and temperature insensitive frequency response.

20 Claims, 11 Drawing Sheets

METHOD AND APPARATUS FOR A HIGH BANDWIDTH AMPLIFIER WITH WIDE BAND PEAKING

FIELD OF THE INVENTION

Aspects of the present invention relate to high speed serial data links. More particularly, aspects of the present invention relate to equalization of high speed serial data links using a high bandwidth amplifier with wide band peaking to improve data link performance.

BACKGROUND

Data signals may be distorted when transmitted over a high speed serial data link. The amplitude and phase distortion of the data signal generally depend on the channel characteristics of the serial data link through which the data signal is transmitted. As the channel length increases and/or the frequency of the data signal increases, channel loss may become significant. The channel typically has a low pass filter characteristic that may distort the high frequency components of the transmitted data signal. This may reduce the eye opening pattern at the receiver and increase inter-symbol interference (ISI).

Present techniques for channel equalization of a high speed serial data link may include the use of a finite impulse response filter at the transmitter to attenuate low frequency components of the data signal with respect to high frequency components. At the receiving end of the channel, a flatter frequency response may be achieved. Additionally, a decision feedback equalizer (DFE) may be employed at the receiver to cancel ISI from one or more previously transmitted data bits. However, these techniques generally do not provide sufficient attenuation for frequency components below $\frac{1}{10}$ of the Nyquist frequency, which results in higher residual ISI when transmitting long strings of 1s or 0s over the serial link. The higher residual ISI reduces the voltage margins and makes the detection of a subsequent 0 (after series of 1s) or a subsequent 1 (after 0s) more difficult.

SUMMARY

A differential amplifier has been designed for a serial data link catering to channels of varying length and characteristics. The fully-differential amplifier works as a linear equalizer at lower frequencies and a linear amplifier at higher frequencies. It employs a novel architecture of two parallel amplifiers, each having a different frequency response which are combined together at the output to obtain a frequency response which is able to compensate for the channel losses. The differential amplifier is also unique in its use of a series capacitor in one of the parallel paths and highly programmable frequency response curve which is relatively insensitive to the process, voltage and temperature variations.

In one example, a high bandwidth amplifier with wide band peaking involves a first path including a differential input coupled with a combination of a first transconductance amplifier and a high pass filter, the combination including a first output coupled with a second transconductance amplifier driving a differential output. The amplifier further involves a second path in parallel with the first path, the second path including a third transconductance amplifier coupled with the differential input, the third transconductance amplifier having a second output coupled with the differential output.

In another example, a method for amplifying a differential input involves the operation of amplifying a differential voltage input proportional to an increasing frequency of the differential input to generate a first amplified differential output. The method further involves the operation of, in parallel with the first operation, amplifying the differential input proportional to the differential voltage to generate a second amplified differential output having a first flat gain response. Finally, the method involves the operation of combining the first amplified differential output with the second amplified differential output to generate a third differential output with a flat gain response up to a low frequency pole (fpole1) and an amplified response between the low frequency pole (fpole1) and a high frequency pole (fpole2).

In another example, a high speed serial data link involves a transmitter providing a differential signal to a receiver over a channel, the channel including an amplifier involving a first path comprising a differential input receiving the differential signal, the differential input coupled with a combination of a first transconductance amplifier and a high pass filter, the combination including a first output coupled with a second transconductance amplifier driving a differential output. The amplifier further includes a second path in parallel with the first path, the second path including a third transconductance amplifier coupled with the differential input and receiving the differential signal, the third transconductance amplifier having a second output coupled with the differential output.

DETAILED DESCRIPTION

Figure 1:
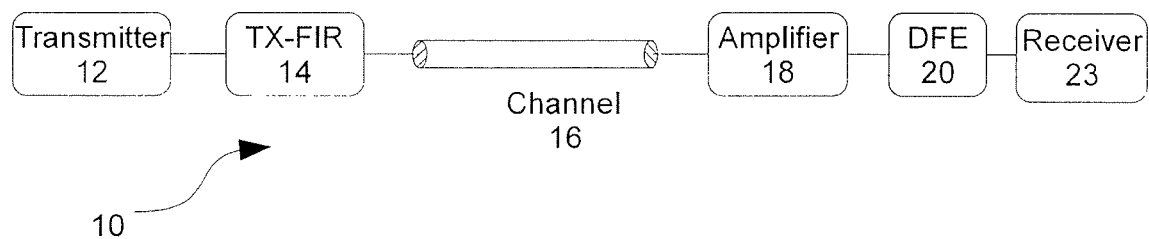
FIG. 1 shows one embodiment for equalizing a high speed serial data link to improve serial data link performance.

FIG. 1 shows one embodiment for equalizing a high speed serial data link 10 to improve link performance. A finite impulse response filter (TX FIR) 14 may be employed at the transmitter 12 to boost high frequency components of the signal at the transmitter with respect to low frequency components before the signal is transmitted over the channel 16 to compensate for channel roll off. A decision feedback equalizer (DFE) 120 with N taps may be employed at the receiver 22 to cancel inter symbol interference (ISI) from the current data symbol due to N previously transmitted data symbols (N may be in one example). The number of DFE taps may be constrained by power consumption and/or chip area considerations. In one embodiment, a DFE with four taps may be utilized. Other embodiments may employ a DFE with more or fewer taps.

Figure 2:
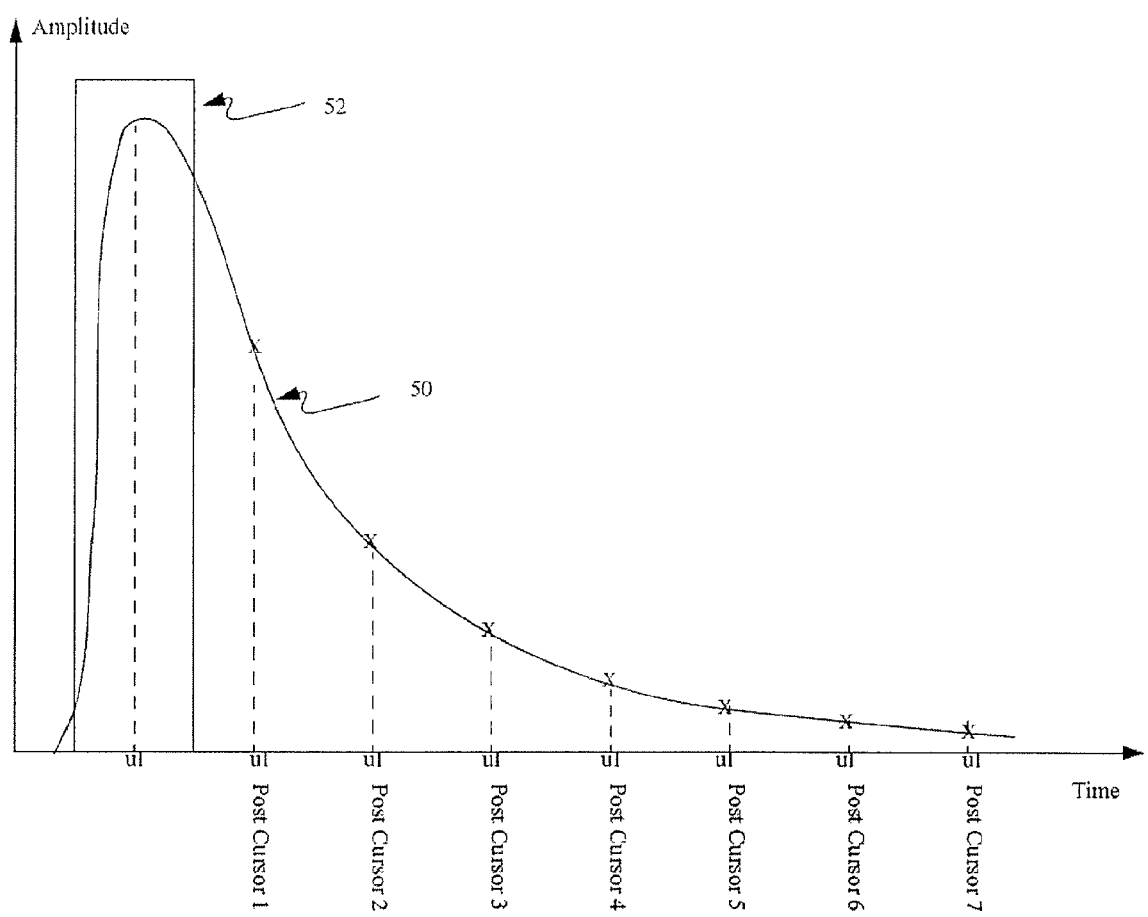
FIG. 2 shows a pulse response of a channel of the high speed serial data link of FIG. 1.

As the channel length increases and/or frequency of the data signal increases, the pulse response of the channel may have a sufficiently long time constant on the falling edge which may introduce ISI beyond the equalization provided by the DFE. That is, there may be residual energy from a transmitted pulse that extends beyond what is equalized by the DFE. A high bandwidth amplifier 18 with wide band peaking may be employed to further reduce the ISI caused by this residual energy. FIG. 2 shows a pulse response 50 to an input pulse 52 of the channel 16 of the high speed serial data link 10 of FIG. 1. The pulse response may extend over many unit intervals (i.e., symbol duration times). A four tap DFE may reduce the residual ISI energy for post cursors one through four. The high bandwidth amplifier may reduce the residual ISI energy for post cursors beyond four.

Figure 3:
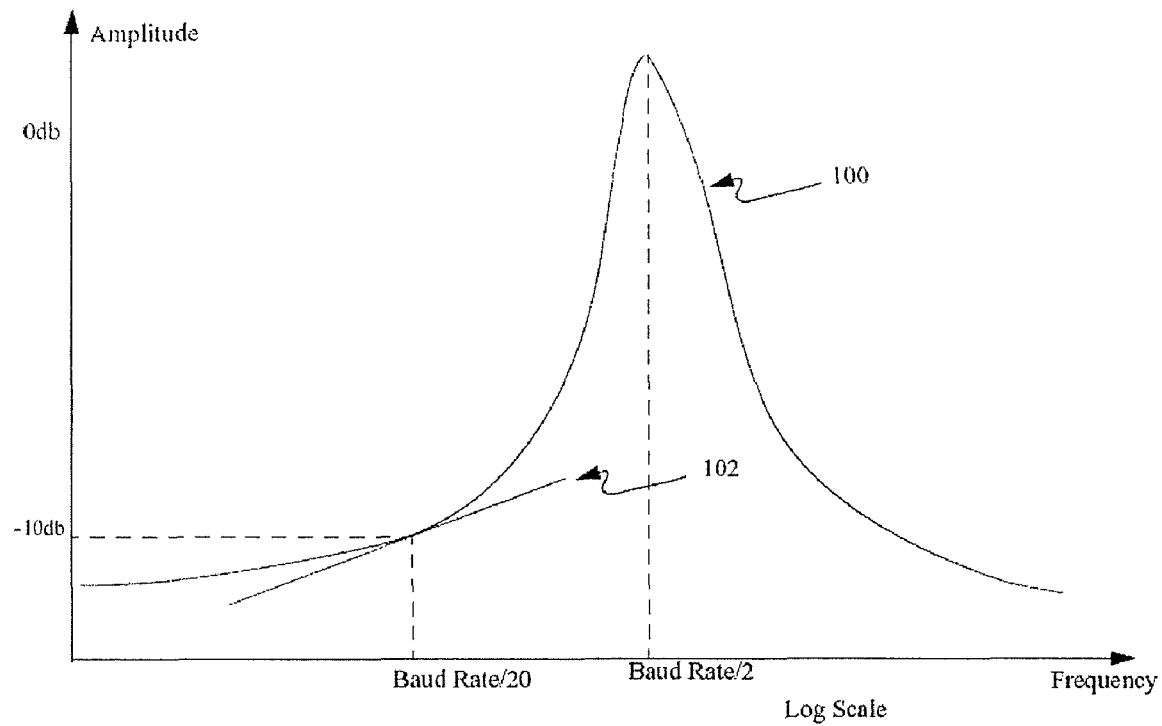
FIG. 3 shows a frequency response of the TX FIR filter of the high speed serial data link of FIG. 1.

FIG. 3 shows a frequency response 100 of the TX FIR filter 14 of the high speed serial data link 10 of FIG. 1. The symbol duration time $T_s$ (or unit interval) is the reciprocal of the symbol rate $f_s$ (also referred to as the baud rate), which is the number of distinct symbol changes made to the channel per second. For example, a 10 Gbps transmission rate may correspond to a 10 GBaud transmission rate. The TX FIR filter may exhibit a peak response at one-half the baud rate (referred to herein as the fundamental frequency of the data signal). The TX FIR response typically compensates for channel loss at a rate of 10 dB/decade starting one decade below the half baud rate. Note that the slope of the TX FIR response around one-twentieth of baud rate (($f_s/2)/10$) indicates that gain of the filter generally is very low, as shown by the tangent 102 of the frequency response near this frequency. This low gain generally limits the TX FIR filter's ability to equalize a channel which exhibits an increasing loss in a frequency range starting from DC (or some very low frequency) up to $f_s/20$. That is, the TX FIR filter generally provides equalization of a channel in a frequency range from $f_s/20$ to $f_s/2$. However, as the data transmission frequency increases, the channel loss below $f_s/20$ may become significant.

The high bandwidth amplifier may compensate for channel losses up to $f_s/20$ to provide a flatter system response starting at a lower frequency (as compared with a serial link without an amplifier). That is, the combined TX FIR filter and high bandwidth amplifier may provide channel equalization (compensate for the channel loss) in a frequency range from about DC to $f_s/2$ to obtain a flatter combined system frequency response. Stated differently, the combined TX FIR and high bandwidth amplifier compensated the signal for the losses occurred due to the frequency response of the channel. The high bandwidth amplifier typically has a flat response from DC to $f_s/20$ and a gain that is about 3 dB higher than the amplifier's DC gain in the frequency range $f_s/20$ to $f_s/2$, the frequency range in which the TX FIR filter provides channel equalization. By compensating for the lower frequency roll off of the channel, an improved eye opening at the receiver may be obtained. Eye opening in representative of the voltage margin (eye height) and time margin (eye width), and is constructed using the superposition of the cross of high and low signals for a time interval. Improvement in the eye opening corresponds to an increase in the eye height and width, which in turn means higher voltage and time margin. In one embodiment, the receiver eye opening may be improved by one to one and one-half least significant bits, where one least significant bit may be about 15 millivolts for a differential signal.

It should be appreciated that by limiting the gain of the high bandwidth amplifier in the equalization frequency range of the TX FIR filter minimizes over equalization of the channel while providing additional equalization at lower frequencies where the equalization provided by the TX FIR filter is limited. Over equalization of the channel may be undesirable due to increased channel noise and/or crosstalk between adjacent high speed serial channels.

Figure 4:
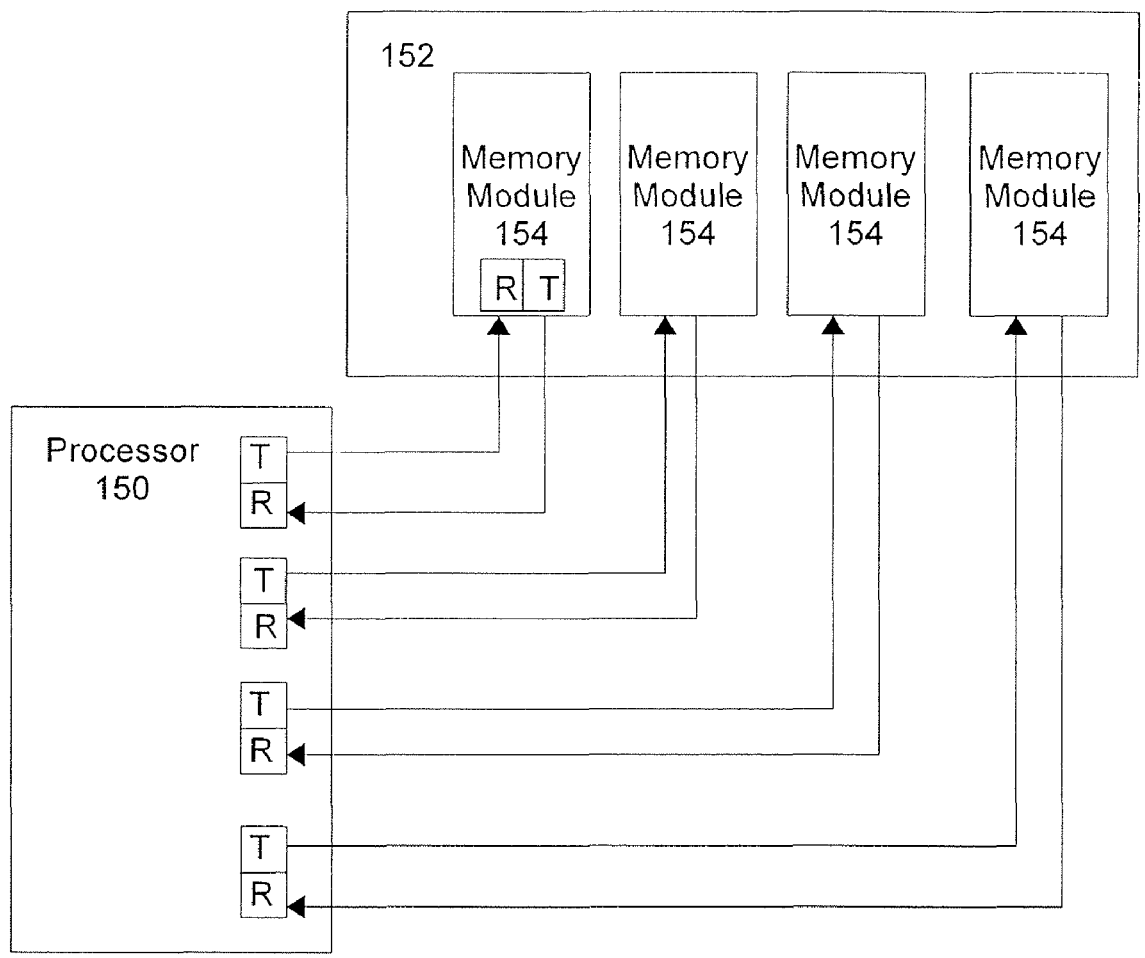
FIG. 4 shows a processor employing multiple serial high speed data links to communicate with a memory.

FIG. 4 shows a processor 150 that may employ multiple serial high speed data links to communicate with a memory 152. The memory may include multiple memory modules 154. The processor may employ a pair of high speed serial data links for each memory module (one to transmit data to the memory module and one to receive data from the memory module). It is to be appreciated that the channel length of the serial data links may vary from one memory module to the next. In one embodiment, the equalization provided by the high bandwidth amplifier may be adjustable to compensate for varying channel length and fundamental frequency of the data signal as well as for manufacturing process variations.

Figure 5:
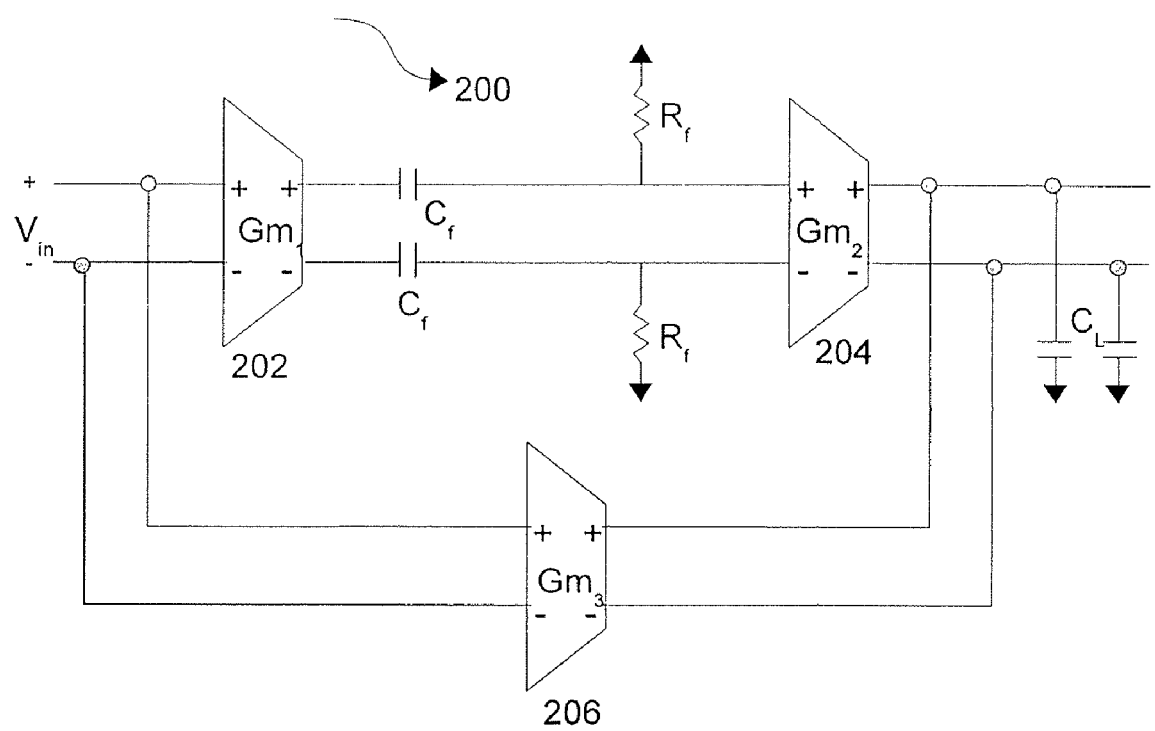
FIG. 5 shows a circuit diagram of a high bandwidth amplifier with wide band peaking employed in one embodiment.

FIG. 5 shows a circuit diagram of a high bandwidth amplifier 200 with wide band peaking employed in one embodiment. Three transconductance cells 202, 204, 206 may be employed. The output current $i_o$ of a transconductance cell is generally linearly related to the differential input voltage signal $v_i$ by:

$i_o=G_m*V_i$, where $G_m$ is the transconductance of the cell.

Gm is measured in units of Siemens (S), where one Siemens is equal to one ampere/volt. Thus, $G_m$ is the ratio of the current at the output port and the voltage at the input port, which may be expressed as $Gm=\Delta i_o/\Delta v_i$. In one embodiment, transconductance cells 202, 204, 206 may have nominal transconductances of 13.9 mS, 21.4 mS and 21.25 mS, respectively.

The circuit shown in FIG. 5 is a type of high pass filter, due to the series capacitance $C_f$. In one embodiment, the dc gain of the circuit is about 1 dB and the high frequency gain region has a gain of about +4 dB relative to the dc gain. The circuit provides two parallel signal paths for an input signal, $v_{in}$. In the first signal path, the input signal flows through the series capacitance, $C_f$. In the second path, the dc path, the input signal flows through the transconductance cell 206. These two parallel signals may be mixed or summed together in the transconductance cell 204, which acts as the last stage of the amplifier and also drives the load capacitance $C_L$. The resistor $R_f$ may provide a dc operating point for the transconductance cell 204.

Figure 6:
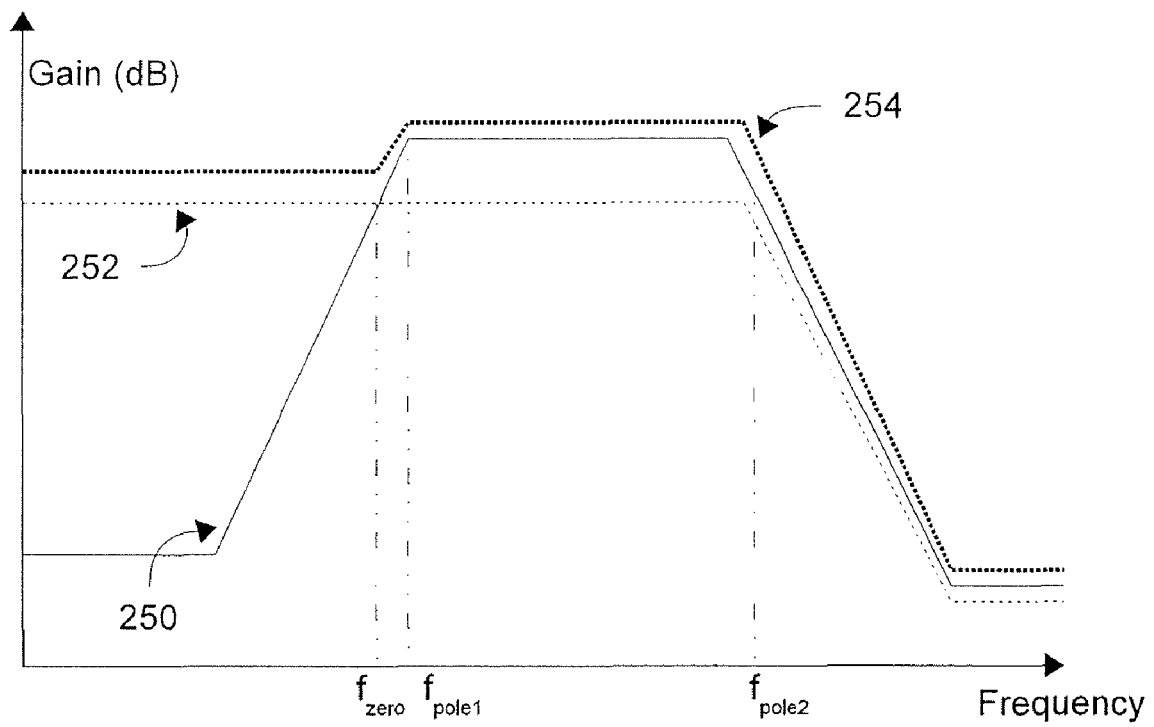
FIG. 6 shows the frequency response of the amplifier of FIG. 5.

FIG. 6 shows the frequency response of the amplifier 200 of FIG. 5. The series capacitance of the first path attenuates the input signal at low frequencies and provides signal gain at high frequencies, as shown by frequency response curve 250. Thus, the first path exhibits a frequency response that is similar to a high pass filter. The second path generally provides a flat gain response that has a bandwidth equal to or greater than the half baud rate of the input signal, as shown by the frequency response curve 252. The overall frequency response of the amplifier is shown by frequency response curve 254. Because the two signal paths are in parallel, the overall frequency response introduces no attenuation at low frequencies including dc, and has a gain boost at higher frequencies before the frequency response rolls off. The bandwidth of the amplifier generally is set to be greater than or equal to the half baud rate of the input signal (i.e., the 3 dB point of the high frequency roll off generally occurs at a frequency greater than or equal to $f_s/2$). As shown by the overall frequency response curve 254, the amplifier typically has a zero frequency $f_{zero}$, a low frequency pole $f_{pole1}$ and a high frequency pole $f_{pole2}$.

Figure 7:
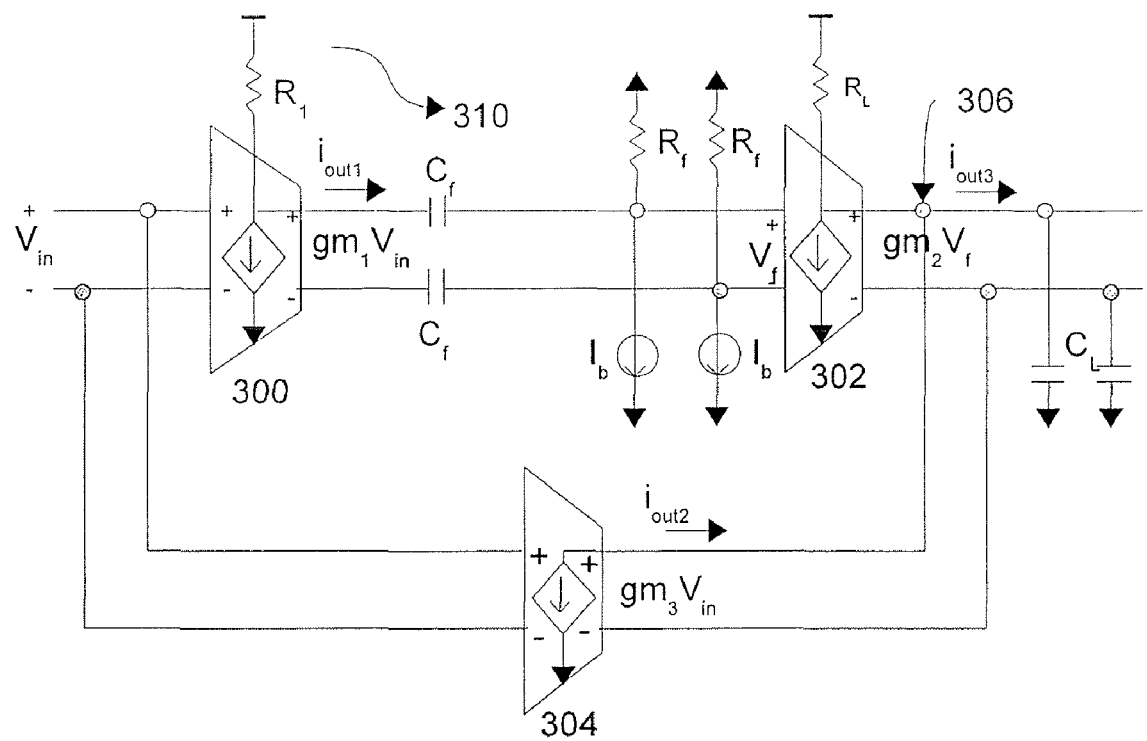
FIG. 7 shows an approximate small signal model for the amplifier of FIG. 5.

FIG. 7 shows an approximate small signal model 310 for the amplifier 200 of FIG. 5. Transconductance cell 300 converts input voltage $V_{in}$ to current $I_{out1}$, which flows through the series capacitor $C_f$ and the resistor $R_f$. The resistor $R_f$ and the current source $I_b$ provide dc bias for transconductance cell 302. The small signal current $i_{out1}$ flows through resistor $R_f$ to produce small signal input voltage $v_f$ for transconductance cell 302. The transconductance cell 302 converts the small signal voltage $v_f$ into a current $i_{out3}$. The input voltage $V_{in}$ is also converted to a current $i_{out2}$ by transconductance cell 304 (the parallel dc path, as previously discussed). The currents $i_{out2}$ and $i_{out3}$ are summed together at the output node 306 to drive the capacitive load, $C_L$.

Figure 8:
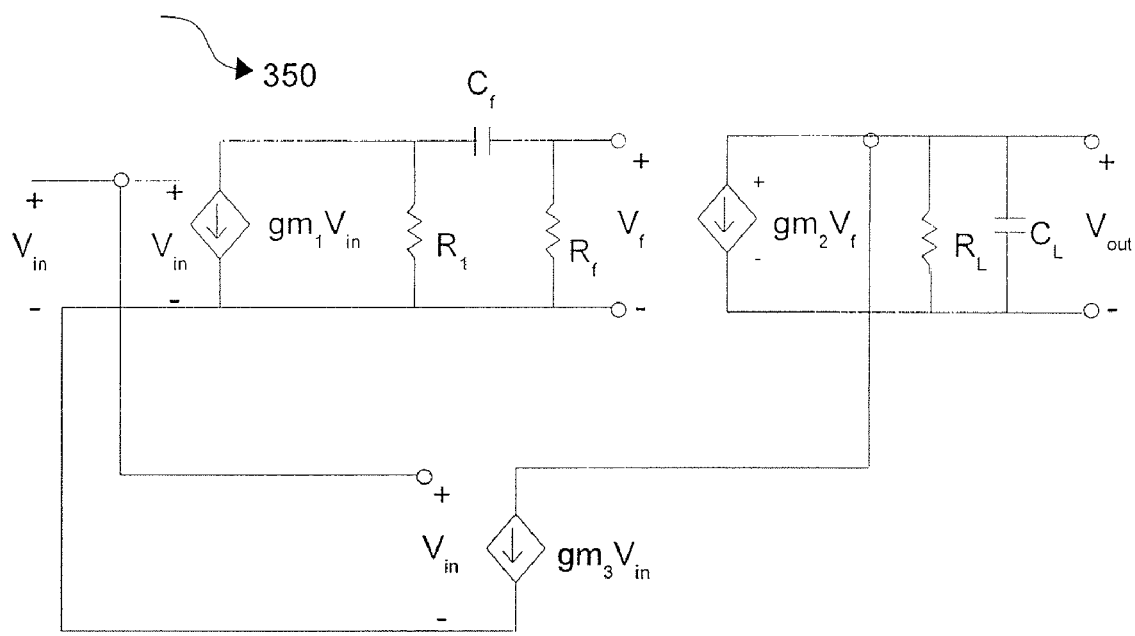
FIG. 8 shows an equivalent small signal model of the amplifier of FIG. 5.

FIG. 8 shows an equivalent small signal model 350 of the small signal model 310 shown in FIG. 7. The small signal gain may be expressed as $$v_{out}/v_{in} = g_{m3} R_L (1 + sC_f[g_{m1} g_{m2} R_1 R_f/g_{m3} + R_1 + R_f])/[(1 + sC_L R_L)(1 + sC_f(R_1 + R_f))]$$

As shown by the gain expression, the amplifier has a dc gain of $g_{m3} R_L$, which is provided by the transconductance cell of the dc input path. The frequency response of the amplifier typically has two poles and a zero. The zero frequency, $f_{zero}$, is approximately given by $$f_{zero} = 1/(2 * pi * C_f * [(g_{m1} * g_{m2} * R_1 * R_f/g_{m3}) + R_1 + R_f]).$$

The low frequency pole, $f_{pole1}$, is approximately given by $f_{pole1} = 1/(2 * pi * C_f * (R_1 + R_f))$ and the high frequency pole, $f_{pole2}$, is approximately given by $$f_{pole2} = 1/(2 * pi * C_L * R_L).$$

Thus, the dominant pole, $f_{pole2}$, may be determined by the load resistor, $R_L$, and the capacitive load, $C_L$, driven by the amplifier. To reduce the overall power consumption of the amplifier and to control the bandwidth of the circuit, the load resistor may be adjustable. Typically, a resistor may have a 20 percent variation due to process variation. In one embodiment, $R_L$ may be adjusted to a nominal value of 60 ohms. This may be done through the use of a set of poly resistors that may be placed in parallel.

The zero frequency is generally a function of the transconductances $g_{m1}$, $g_{m2}$ and $g_{m3}$, the resistances $R_f$ and $R_1$ and the capacitor $C_f$. The low frequency pole, $f_{pole1}$, helps achieve a flat peak gain region. The low frequency pole is generally dependent upon capacitance $C_f$ and resistors $R_1$ and $R_f$. In one embodiment, the zero frequency may occur at about 20 MHz, the low frequency pole may occur at about 400 MHz and the high frequency pole may occur at about 5 GHz for a 5 GBaud high speed serial data link.

It is to be appreciated that the series capacitance in the signal path one blocks dc. As a result, additional circuitry may be needed to establish a dc operating point in the linear region of the second transconductance cell. When a long string of logic ones are transmitted in a row, the capacitor may build up a charge that could shift the output dc voltage level. This may slow the response of the amplifier when a logic zero is transmitted after the long string of logic ones. The parallel dc path may be used to provide a constant dc level at the output that is not shifted by the capacitance charge build up, allowing a faster amplifier response.

Additionally, the amplifier may be used as a receiver of a serializer/deserializer (SERDES) link. When the amplifier is used as a receiver of a SERDES link, the input signal may be a current mode logic signal referenced to a termination voltage, $V_{DDt}$. The output signal common mode voltage may be referenced to a voltage supply, $V_{DDa}$, that is lower than the termination voltage.

Figure 9:
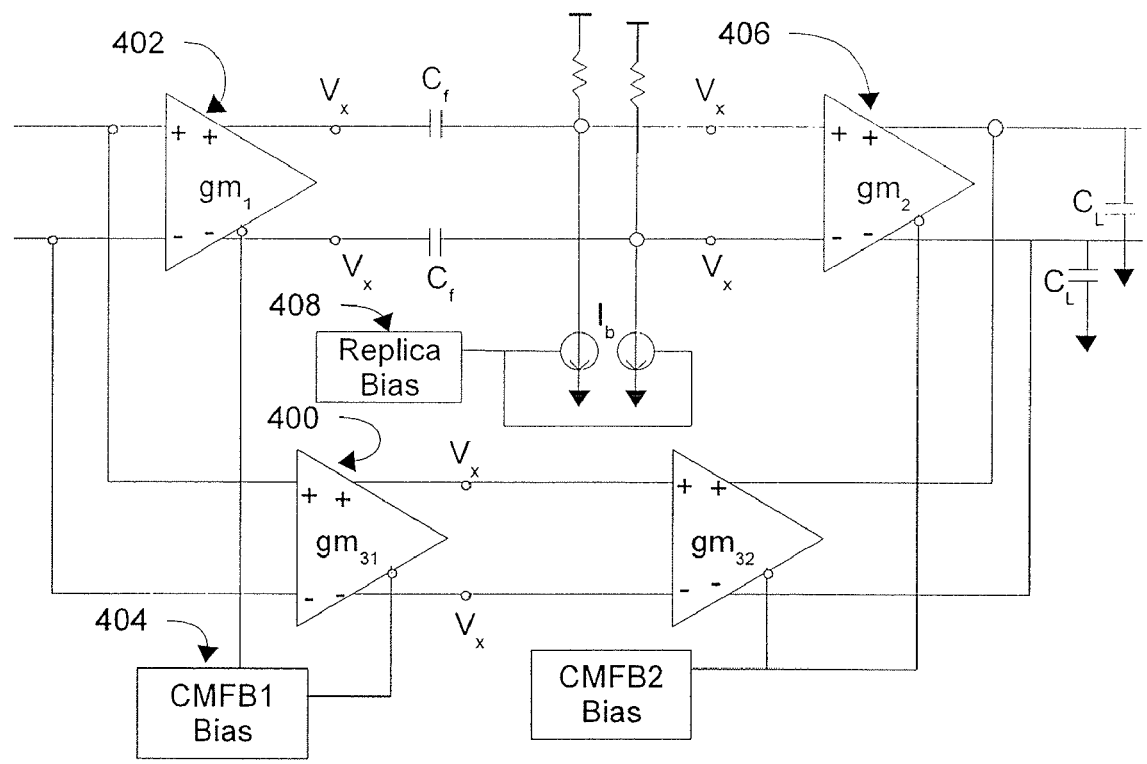
FIG. 9 shows one embodiment of high bandwidth amplifier that may accommodate a wide variation in input common mode voltage while providing a constant output common mode voltage.

The high bandwidth amplifier may be designed to accommodate a wide variation in input common mode voltage while providing a constant output common mode voltage. In one embodiment, $V_{DDt}$ may be about 1.2 volts while $V_{DDa}$ may be about 1.0 volt. The output common mode voltage may need to be held at about 0.75 volt. To achieve the desired common mode input voltage range for the input and the gain performance at a low voltage design, one embodiment may include another transconductance cell 400 in the dc path, as shown in FIG. 9. In one embodiment, the transconductance cell 400 may have a nominal transconductance of 13.85 mS.

The output common mode voltage levels of transconductance cells 400 and 402 may be set to an intermediate voltage level $V_x$ by using a CMFBI (common mode feedback circuit) bias circuit 404 to bias the transconductance cells 400 and 402. $V_x$ may be chosen to be proportional to the difference of the power supplies of the input and output stages of the amplifier. The input of the transconductance cell 406 may be biased at $V_x$ by a replica bias circuit 408.

Figure 10:
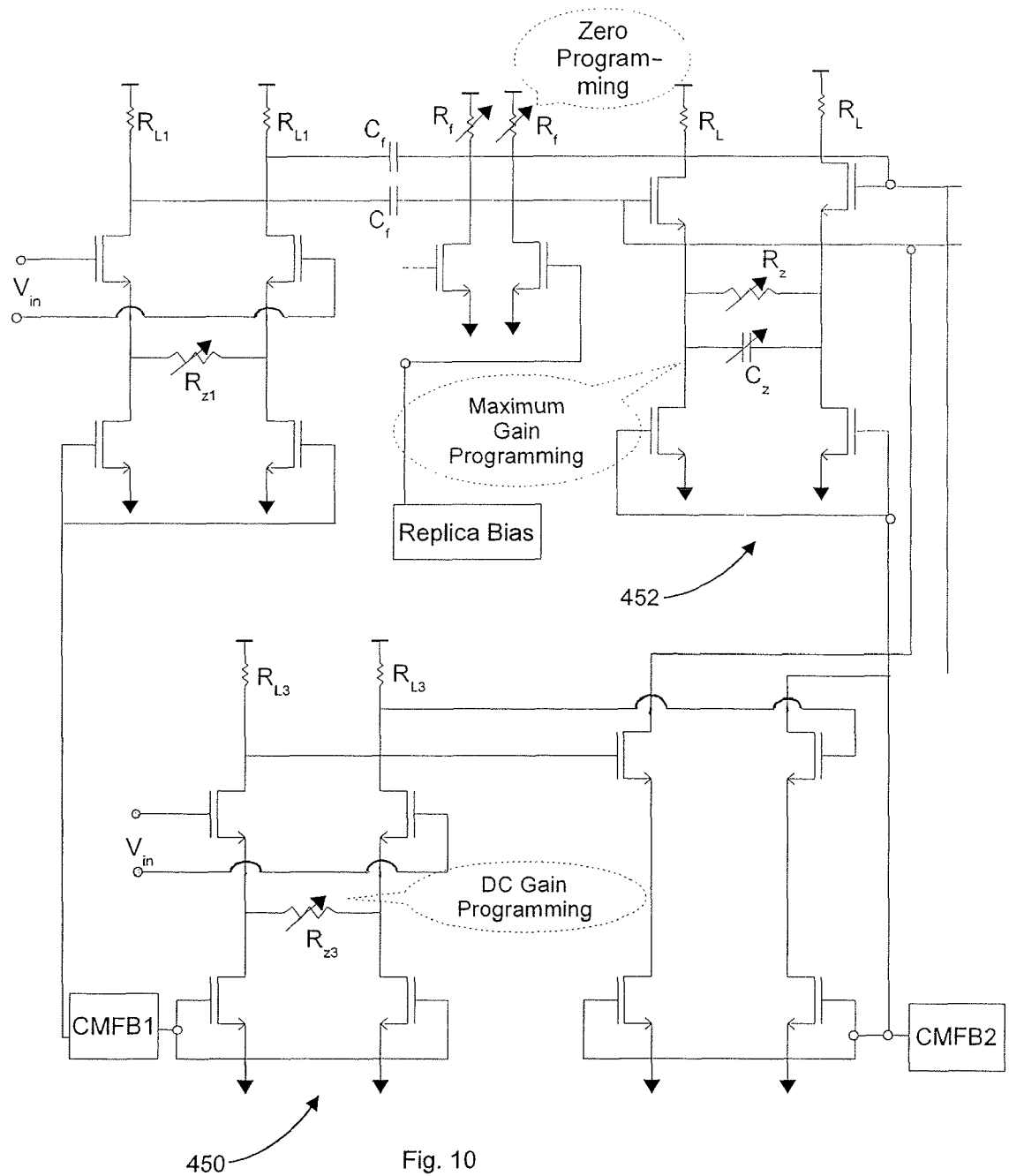
FIG. 10 shows one embodiment of the high bandwidth amplifier having a programmable dc gain, a programmable max gain and a programmable zero frequency capability.

In certain embodiments, one or more of the dc gain, the max gain and the zero frequency may be programmable. FIG. 10 shows one embodiment of the high bandwidth amplifier having a programmable dc gain, a programmable max gain and a programmable zero frequency capability. The DC gain may be varied by introducing a programmable source degeneration resistor $R_{Z3}$ in the $g_{m31}$ transconductance cell 450. The dc gain generally depends on the gain of the $g_{m31}$ transconductance cell 450, which is typically equal to $g_{m31} * R_{L3}$. Introduction of a source degeneration resistor $R_{Z3}$ generally results in a dc gain that is approximately given by $$dc\ gain = (g_{m31} * R_{L3})/(1 + g_{m31} * R_{Z3}).$$

By making $R_{Z3}$ variable, the dc gain may be made programmable. In one embodiment, $R_{Z3}$ may include a set of poly resistors that may be connected in parallel to program the dc gain of the amplifier. The nominal resistance of $R_{Z3}$ may be adjusted from about 425 ohms to about 120 ohms in increments of about 61 ohms. This may provide a dc gain that may be adjusted from about 1 dB to about 7 dB in 1 dB increments. In one embodiment, the dc gain may be programmed using three bits.

The max gain of the amplifier may be made programmable by introducing a source degeneration resistor $R_Z$ and a source degeneration capacitor $C_Z$ in transconductance cell 452. Recall that the transconductance cell 452 typically provides gain at higher frequencies. The max gain of the amplifier may be set by adjusting the source degeneration resistor $R_Z$, without changing the dc gain of the amplifier. The source degeneration capacitor $C_Z$ may introduce a high frequency zero that may cancel some effect of the dominant pole, thereby extending the bandwidth of the amplifier.

In one embodiment, the resistance $R_Z$ may be programmed to the values 175 ohms, 150 ohms, 125 ohms, 100 ohms, 75 ohms, 55 ohms, 40 ohms and 25 ohms such that the max gain of the amplifier may be adjusted in about 0.5 dB increments from 1 db to 6 db. The capacitance $C_Z$ may be adjusted from about 300 femto farads (fF) to about 750 fF in 150 fF increments.

The zero frequency of the amplifier may be made programmable by making the resistance $R_f$ programmable. In one embodiment, the capacitance $C_f$ may be 300 fF and the resistance Rf may be programmed to the nominal values of 3 kilo ohms (kΩ), 2.5 kΩ, 2 kΩ, 1.5 kΩ and 1.2 kΩ. This may provide a zero frequency that may be adjusted from about 350 MHz to 700 MHz in approximately 100 MHz increments.

Figure 11:
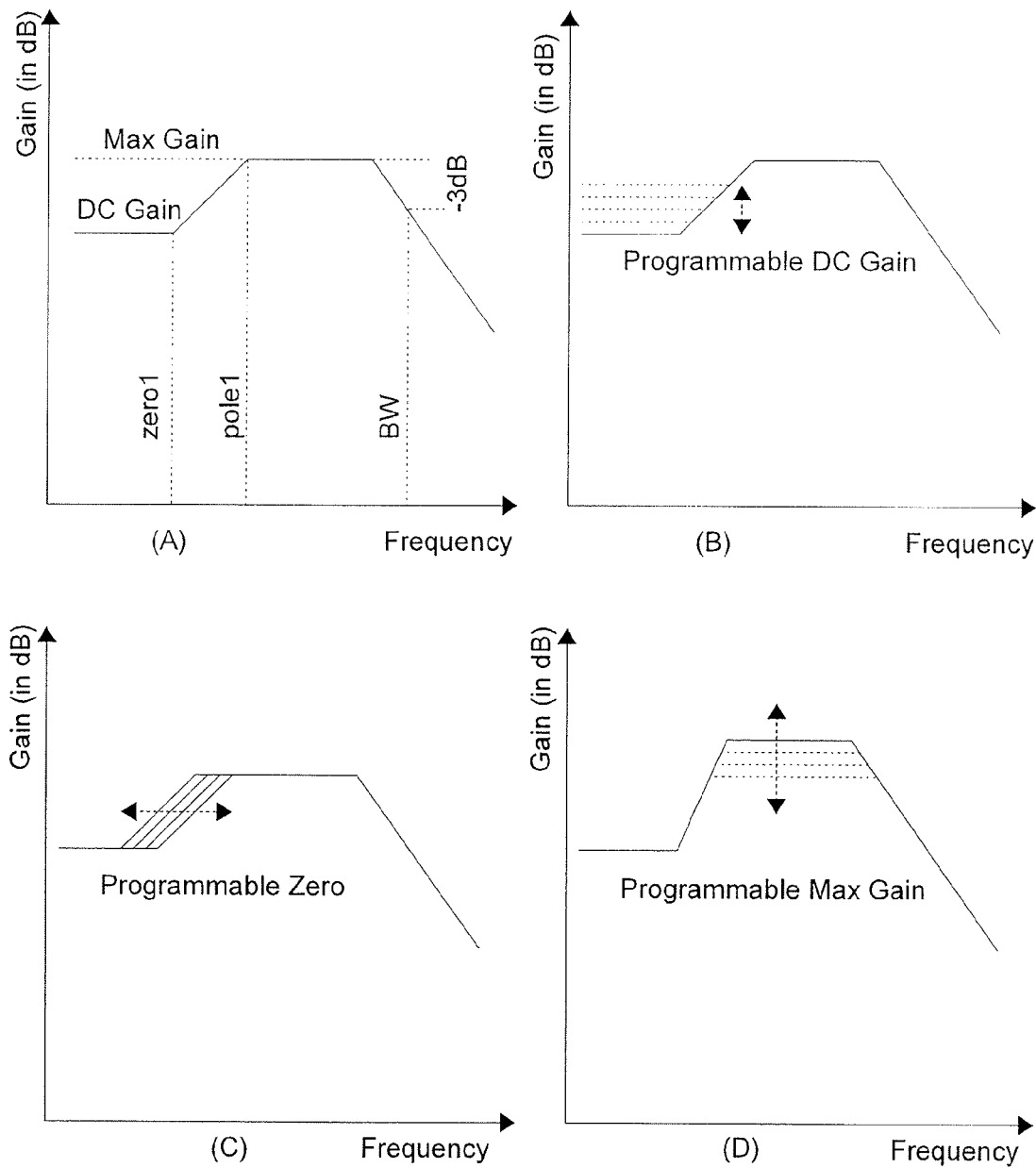
FIGS. 11A-11D are frequency response graphs illustrating the frequency response characteristics of the high bandwidth amplifier of FIG. 10.

FIGS. 11A-11D illustrate the frequency response characteristics of the high bandwidth amplifier of FIG. 10 that may be altered by adjusting DC gain (FIG. 11B), the programmable zero (FIG. 11C) and the programmable max gain (FIG. 11D). FIG. 11A, similarly to FIG. 6, generally shows the frequency response of the high bandwidth amplifier of FIG. 10. By adjusting DC gain using the degeneration resistor $R_{z3}$, the DC gain of the amplifier may be adjusted, particularly in the region up to $pole_1$ as shown in FIG. 11B. By adjusting $R_f$, the location of $zero_1$ and $pole_1$ may be adjusted as shown in FIG. 11C. Finally, by adjusting $R_z$ and $Cz$, the max gain of the amplifier may be adjusted as shown in FIG. 11D.

While the present invention has been described in the context of specific embodiments and processes, such descriptions are by way of example and not limitation. Other embodiments may combine or omit certain features and/or operations. Accordingly, the proper scope of the present invention is specified by the following claims and not by the preceding examples.

What is claimed is:

1. An amplifier comprising:
a first path comprising a differential input coupled with a combination of a first transconductance amplifier and a high pass filter, the combination including a first output coupled with a second transconductance amplifier driving a differential output; and
a second path in parallel with the first path, the second path including a third transconductance amplifier coupled with the differential input, the third transconductance amplifier having a second output coupled with the differential output.

2. The amplifier of claim 1 wherein the high pass filter comprises:
a first capacitor in series with and connected to a first differential output of the first transconductance amplifier; and
a second capacitor in series with and connected to a second differential output of the first transconductance amplifier.

3. The amplifier of claim 2 further comprising:
a first resistor coupled between a first differential input of the second transconductance cell and a voltage supply; and
a second resistor coupled between a second differential input of the second transconductance cell and the voltage supply.

4. The amplifier of claim 3 wherein the first resistor and second resistor are programmable to provide adjustability of a zero frequency ($f_{zero}$).

5. The amplifier of claim 1 wherein:
the first path provides a high pass filter frequency response between a first signal frequency and a second signal frequency of a differential signal on the differential input, the first path further amplifying the differential signal at least between the first frequency and the second frequency;
the second path provides a flat gain response for the differential input, the flat gain response extending at least to the second signal frequency;
the differential output providing an output frequency response of the first path and the second path.

6. The amplifier of claim 1 further comprising:
an adjustable load resistor coupled to the second transconductance amplifier, the adjustable load resistor to set a high frequency pole $f_{pole2}$.

7. The amplifier of claim 1 further comprising:
a programmable resistor operably coupled with the third transconductance cell to provide a programmable DC gain of the second path.

8. The amplifier of claim 1 further comprising:
a source degeneration resistor operably coupled with the second transconductance cell;
a source degeneration capacitor operably coupled with the second transconductance cell; and
wherein the source degeneration resistor and source degeneration capacitor providing a programmable maximum gain of the first path.

9. The amplifier of claim 1 further comprising:
a fourth transconductance amplifier in the second path, the fourth transconductance amplifier coupled with the differential input and having a differential output coupled with the third transconductance amplifier.

10. The amplifier of claim 9 further comprising:
at least one CMFBI bias circuit coupled with at least one of the third transconductance amplifier and the fourth transconductance amplifier.

11. The amplifier of claim 9 wherein the first transconductance amplifier has a nominal transconductance of 13.9 mS, the second transconductance amplifier has a nominal transconductance of 21.4 mS, the third transconductance amplifier has a nominal transconductance of 21.25 mS and the fourth transconductance amplifier has a nominal transconductance of 13.85 mS.

12. A method for amplifying a differential input, the method comprising:
amplifying a differential voltage input proportional to an increasing frequency of the differential input to generate a first amplified differential output;
in parallel, amplifying the differential input proportional to the differential voltage to generate a second amplified differential output having a first flat gain response; and
combining the first amplified differential output with the second amplified differential output to generate a third differential output with a flat gain response up to a low frequency pole ($f_{pole1}$) and an amplified response between the low frequency pole ($f_{pole1}$) and a high frequency pole ($f_{pole2}$).

13. The method of claim 12 wherein the second amplified differential output has a second substantial flat gain response in a frequency band at least between the low frequency pole and the high frequency pole, wherein the second substantially flat gain rain response exceeds the first flat gain response.

14. The method of claim 13 wherein the low frequency pole is set at one twentieth of a baud rate of the differential input and the high frequency pole is set at one half of the symbol rate.

15. A high speed serial data link comprising:
a transmitter providing a differential signal to a receiver over a channel, the channel including an amplifier comprising
a first path comprising a differential input receiving the differential signal, the differential input coupled with a combination of a first transconductance amplifier and a high pass filter, the combination including a first output coupled with a second transconductance amplifier driving a differential output; and
a second path in parallel with the first path, the second path including a third transconductance amplifier coupled with the differential input and receiving the differential signal, the third transconductance amplifier having a second output coupled with the differential output.

16. The high speed serial data link of claim 15 further comprising:
   a finite impulse response filter coupled with the transmitter to boost high frequency components of the differential signal;
   a decision feedback equalizer coupled with the receiver to cancel some inter symbol interference.

17. The high speed serial data link of claim 16 wherein:
   the high pass filter comprises a first capacitor in series with and connected with a first differential output of the first transconductance amplifier, and a second capacitor in series with and connected with a second differential output of the first transconductance amplifier.

18. The high speed serial data link of claim 17 wherein:
   the amplifier further comprises a first resistor coupled between a first differential input of the second transconductance cell and a voltage supply, and a second resistor coupled between a second differential input of the second transconductance cell and the voltage supply.

19. The high speed serial data link of claim 18 wherein the first resistor and the second resistor of the amplifier are programmable to provide adjustability of a zero frequency ($f_{zero}$).

20. The high speed serial data link of claim 19 wherein:
the amplifier further comprising:
   the first path of provides a high pass filter frequency response between a first signal frequency and a second signal frequency of a differential signal on the differential input, the first path further amplifying the differential signal at least between the first frequency and the second frequency, the second path provides a flat gain response for the differential input, the flat gain response extending at least to the second signal frequency, the differential output providing an output frequency response of the first path and the second path;
   an adjustable load resistor coupled to the second transconductance amplifier, the adjustable load resistor to set a high frequency pole $f_{pole2}$;
   a programmable resistor operably coupled with the third transconductance cell to provide a programmable DC gain of the second path;
   a source degeneration resistor operably coupled with the second transconductance cell;
   a source degeneration capacitor operably coupled with the second transconductance cell; and
   wherein the source degeneration resistor and source degeneration capacitor providing a programmable maximum gain of the first path.

* * * * *